(12) United States Patent
Kawasaki et al.

(10) Patent No.: US 7,157,781 B2
(45) Date of Patent: Jan. 2, 2007

(54) ENHANCEMENT OF MEMBRANE CHARACTERISTICS IN SEMICONDUCTOR DEVICE WITH MEMBRANE

(75) Inventors: Eishi Kawasaki, Kuwana (JP);
Hisanori Yokura, Chiryu (JP);
Kazuhiko Sugiura, Nagoya (JP)

(73) Assignee: Denso Corporation, Kariya (JP)

( * ) Notice: Subject to any disclaimer, the term of this patent is extended or adjusted under 35 U.S.C. 154(b) by 221 days.

(21) Appl. No.: 10/425,663

(22) Filed: Apr. 30, 2003

(65) Prior Publication Data
US 2003/0215974 A1 Nov. 20, 2003

(30) Foreign Application Priority Data
May 14, 2002 (JP) .............................. 2002-138549

(51) Int. Cl.
*H01L 29/84* (2006.01)
*H01L 21/00* (2006.01)

(52) U.S. Cl. .............................. 257/419; 257/E21.553; 438/53

(58) Field of Classification Search ................. 438/50, 438/53; 257/419
See application file for complete search history.

(56) References Cited

U.S. PATENT DOCUMENTS

| | | | |
|---|---|---|---|
| 5,369,544 A * | 11/1994 | Mastrangelo | ............ 361/283.4 |
| 6,159,762 A | 12/2000 | Scheiter et al. | |
| 6,297,150 B1 | 10/2001 | Morinaga | |
| 6,518,083 B1 * | 2/2003 | Sato et al. | ..................... 438/50 |
| 6,802,222 B1 * | 10/2004 | Ishio et al. | ................... 73/718 |

FOREIGN PATENT DOCUMENTS

| | | | |
|---|---|---|---|
| JP | 07-035768 | * | 7/1995 |
| JP | A-2000-124470 | | 4/2000 |
| JP | A-2000-131169 | | 5/2000 |
| JP | 2000-214035 | * | 8/2000 |
| JP | A-2000-214035 | | 8/2000 |
| WO | WO98/24119 | | 11/1997 |

OTHER PUBLICATIONS

Keiich Shimaoka, "Sensitivity Analysis of a Micro-Pressure Sensor Having Thin Film Diaphragm", *Toyoda Chuo Kenkyusho R&D Review*, vol. 31, No. 4, Dec. 1996 pp. 23-30.
Notification of Reason(s) for Refusal in JP2002-138549, mailed Nov. 15, 2005; and copy of English translation.
Christopher Hierold, "Intelligent CMOS Sensors", pp. 1-6, *IEEE The Thirteenth Annual International Converence on Micro Electro Mechanical Systems 2000 (MEME2000)*, Jan. 23, 2000.

* cited by examiner

*Primary Examiner*—W. David Coleman
(74) *Attorney, Agent, or Firm*—Posz Law Group, PLC

(57) ABSTRACT

A semiconductor device having a membrane includes a semiconductor substrate, which has an active surface, and a membrane. A cavity is located between the active surface and the membrane and hermetically sealed. The membrane includes a first film, which has a through hole that extends through the first film, and a second film, which has been formed by reflowing a reflow layer made of a material that becomes viscous and reflows when heated. The through hole has been plugged by the second film.

4 Claims, 4 Drawing Sheets

ENHANCEMENT OF MEMBRANE CHARACTERISTICS IN SEMICONDUCTOR DEVICE WITH MEMBRANE

CROSS REFERENCE TO RELATED APPLICATION

This application is based on and incorporates herein by reference Japanese Patent Application No. 2002-138549 filed on May 14, 2002.

BACKGROUND OF THE INVENTION

The present invention relates to a semiconductor device including a surface micromachined membrane and relates to a method of manufacturing the device.

This type of semiconductor device includes a substrate and a membrane. The membrane is formed above the active surface of a semiconductor substrate, where electric elements are formed. A cavity is located between the active surface and the membrane and hermetically sealed. The cavity and the membrane are formed by, for example, stacking two films on the active surface and etching one underlying film through a hole in the other overlying film. As an example of such a semiconductor device, a surface micromachined pressure sensor is known.

A surface micromachined pressure sensor is proposed in JP-A-2001-504994. The method proposed for manufacturing the pressure sensor is shown in FIGS. 1A to 1F. Firstly, as shown in FIG. 1A, a lower electrode 510, which is, for example, a p-type-impurity-diffused layer (p well), is formed in an active surface of a silicon substrate 500, and then a silicon oxide film 520 is formed to cover the lower electrode 510. Then, as shown in FIG. 1B, an impurity-doped polysilicon layer is deposited and patterned out into predetermined shapes. Then, an impurity-doped polysilicon film 530 is completed by forming etching holes 540 in the impurity-doped polysilicon layer using photolithography and etching. The etching holes 540 extend down from the surface of the polysilicon film 530 to the silicon oxide film 520.

Then, as shown in FIG. 1C, the silicon oxide film 520 and the polysilicon film 530 are covered by a resist 550 such that the etching holes 540 are exposed, and the silicon oxide film 520 is partially etched underneath the polysilicon 530 through the etching holes 540 using, for example, hydrofluoric acid (HF) aqueous solution. As a result, a pressure reference chamber 560, or a cavity 560, is formed at the region that the etched portion of the silicon oxide film 520 has occupied.

Then, as shown in FIG. 1D, the resist 550 is stripped off, and a silicon oxide film 570 is deposited in order to hermetically seal the reference chamber 560 by plugging the etching holes 540. Next, as shown in FIG. 1E, electrodes 580 made of, for example, aluminum are formed for electrically accessing the lower electrode 510 and the polysilicon film 530, and a passivation film 590, which is made of, for example, silicon nitride, is formed. A membrane that includes a portion of the polysilicon 530, a portion of the silicon oxide film 570, and a portion of the passivation film 590 is formed above the pressure reference chamber 560.

Next, as shown in FIG. 1F, the passivation film 590 and the silicon oxide film 570 are stripped off at a predetermined portion in order to define a deforming part 505 in the membrane. Since the membrane becomes thinner and deforms more easily at the portion, where the films 570, 590 have been stripped off, than the rest of the membrane, the part of the membrane that is located inside the portion is defined as the deforming part 505, as shown in FIG. 1F.

The reason why the deforming part 505 needs to be defined is that it is difficult to precisely control the dimensions of the membrane because there are no etch stops when the reference chamber 560 is formed by partially etching the silicon oxide film 520, which is a sacrificial layer. The pressure sensor of FIG. 1F functions as a parallel-plate-type capacitive pressure sensor. That is, a capacitor is formed by the polysilicon film 530, which functions an electrode, and the lower electrode 510. When the deforming part 505 is displaced under a pressure, the distance between the polysilicon film 530 and lower electrode 510 changes and the capacitance of the capacitor also changes. Therefore, the pressure is detected by detecting the capacitance change.

Other than the semiconductor device including a surface micromachined membrane, which is represented by the pressure sensor described above, there is also a semiconductor device including a back micromachined membrane. The membrane is formed in the back surface of a semiconductor substrate, which is opposite to the active surface, where electric elements are formed. For example, in the manufacturing process of a back micromachined pressure sensor, a membrane is formed by partially etching a silicon substrate from the back surface, which is opposite to the active surface on which electric elements such as strain gauges and electrodes are formed. A pressure reference chamber, or a cavity, is formed at the region that the etched portion of the substrate has occupied by bonding a glass stand to the back surface of the silicon substrate.

When a back micromachined pressure sensor and a surface micromachined pressure sensor are compared, the pressure reference chamber of the surface micromachined pressure sensor, which is formed by partially etching a sacrificial layer, tends to have a volume more than two orders of magnitude smaller than that of the back micromachined pressure sensor, which is formed by partially etching the silicon substrate of the sensor from the back surface.

Because even a small change in pressure inside the reference chamber significantly affects the sensor characteristics, a hermetic seal is extremely critical in the surface micromachined pressure sensor. The hermeticity of the reference chamber 560 depends strongly on the method for depositing the silicon oxide film 570 to plug the etching holes 540 in the manufacturing step shown in FIG. 1D. As film deposition methods that are compatible with a semiconductor process, chemical vapor deposition (CVD) and physical vapor deposition (PVD) are used to form the silicon oxide film 570. However, the deposition methods have the following problems.

If the silicon oxide film 570 is formed by low pressure CVD, the source species enter the reference chamber 560 through the etching holes 540. As a result, the silicon oxide film 570 is partially deposited inside the reference chamber 560 to change the thickness of the membrane and prevent the membrane from deforming smoothly. In the worst case, the silicon oxide film 570 forms columns in the reference chamber 560 to completely prevent the membrane from deforming.

If the silicon oxide film 570 is deposited by atmospheric pressure CVD, the pressure inside the reference chamber 560 becomes at the atmospheric level. Therefore, the pressure inside the reference chamber 560 changes in response to the ambient temperature according to Boyle-Charles law. As a result, the membrane deforms in response to the ambient temperature, and the sensor output is influenced by the ambient temperature. Especially, when the pressure level to be detected is low, the sensor output is significantly influenced by the ambient temperature.

If the silicon oxide film 570 is formed by plasma CVD (P-CVD), a slit 575 can be generated in the silicon oxide film 570, for example, near a step located at an end the polysilicon film 530, as shown in FIG. 1D. The slit 575 means a crack, flaw, and so on, which narrows the area hermetically sealed by the silicon oxide film 570 and worsens the reliability in the hermetic sealing.

Even if the silicon oxide film 570 is deposited by PVDs such as sputtering, the coverage of the silicon oxide film 570 at the step is as poor as that with P-CVD. Therefore, the area hermetically sealed by the silicon oxide film 570 is narrowed, and the reliability in the hermetic sealing is insufficient.

The problems described above are common to all surface micromachined semiconductor devices, in which a cavity located on the active surface of a semiconductor substrate is hermetically sealed by a membrane, and are not limited to the surface micromachined pressure sensor described above. For example, a thermopile infrared sensor in which the element for detecting infrared has been formed on a membrane can provide a high detection precision as long as high vacuum is maintained in a cavity in order to thermally insulate the membrane. However, if the hermetic sealing of the cavity is not reliable, the membrane can deteriorate in thermal insulation.

SUMMARY OF THE INVENTION

The present invention has been made in view of the above aspects with an object to provide a surface micromachined semiconductor device, in which a cavity located on the active surface of a semiconductor substrate is hermetically sealed using a membrane, and which has good membrane characteristics and high reliability in hermetic sealing of the cavity.

To achieve the object, a semiconductor device having a membrane according to the present invention includes a semiconductor substrate, which has an active surface, and a membrane. A cavity is located between the active surface and the membrane and hermetically sealed. The membrane includes a first film, which has a through hole that extends through the first film, and a second film, which has been formed by reflowing a reflow layer made of a material that becomes viscous and reflows when heated. The through hole has been plugged by the second film to hermetically seal the cavity.

A method for manufacturing the semiconductor device includes: forming a sacrificial layer at a position where a cavity is to be formed on an active surface of a semiconductor substrate; forming a first film, a part of which is to be a part of a membrane, to cover the sacrificial layer; forming a through hole, which extends through the first film; forming a reflow layer, which is made of a material that becomes viscous when heated, to cover the first film such that the through hole is plugged by the reflow layer; forming an etching hole, which permits the sacrificial layer to be exposed to an outside, such that the etching hole is located at a position corresponding to the through hole; etching the sacrificial layer through the etching hole to form a cavity; and reflowing the reflow layer by heating to form a second film, a part of which is to be a part of the membrane. The etching hole and the through hole are plugged by the second film when the reflow layer is reflowed.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The present invention will be described in detail with reference to various embodiments.

Figure 2:
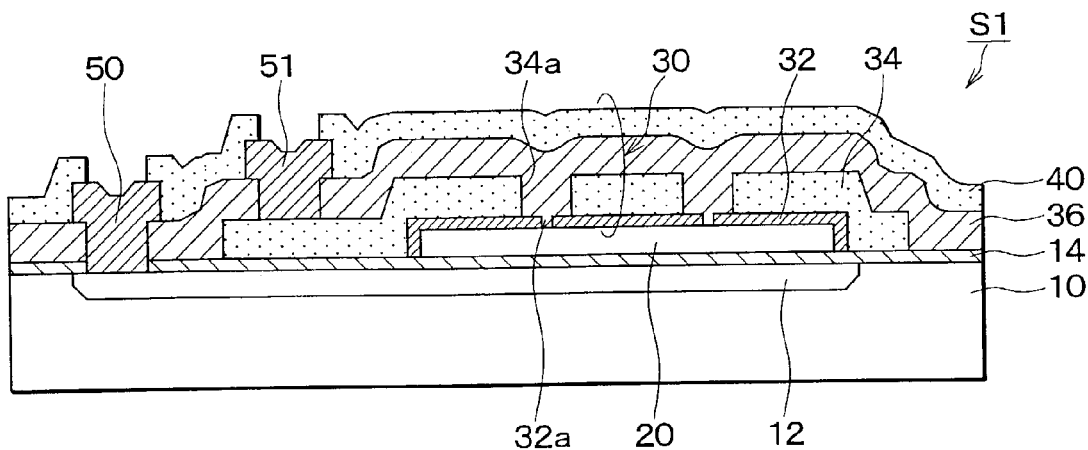
FIG. 2 is a schematic cross-sectional view of a surface micromachined pressure sensor according to an embodiment of the present invention.

As shown in FIG. 2, a pressure sensor S1 includes a cavity 20, which is located on an active surface of a silicon substrate 10, and a membrane 30, which is located above the cavity 20 to hermetically seal the cavity 20. The membrane 30, which is a diaphragm, deforms in response to the ambient pressure that is applied to the membrane 30 from the outside of the sensor S1. A low resistivity layer 12, which functions as an electrode, is located in the active surface of the silicon substrate 10, which is a semiconductor. In the pressure sensor S1 of FIG. 2, the low resistivity layer 12 is an impurity diffusion layer such as a p-type well layer and an n-type well layer, which has a conductivity type different from the initial conductivity type of the silicon substrate 10.

The active surface of the silicon substrate 10 is covered by a first silicon oxide film 14, which is located on the low resistivity layer 12 except for a contact hole. The first silicon oxide film 14 functions as a protective film for protecting the silicon substrate 10 when a sacrificial layer made of a polysilicon or an amorphous silicon, which will be described later, is etched. The first silicon oxide film 14 may be formed by thermal oxidation, sputtering, CVD, and so on.

A second silicon oxide film 32, which includes through holes 32a, is located on the first silicon oxide film 14. The above mentioned cavity 20 is defined by the second silicon oxide film 32 and the first silicon oxide film 14, as illustrated in FIG. 2. The second silicon oxide film 32 may be, for example, circular shaped, when viewed from the top of the pressure sensor S1 in FIG. 2. The second silicon oxide film 32 is covered by a first film 34, or a polysilicon film 34, which includes through holes 34a.

As shown in FIG. 2, the through holes 32a in the second silicon oxide film 32 communicate with the through holes 34a in the polysilicon film 34. The polysilicon film 34 functions as an electrode. The polysilicon film 34 and the low resistivity layer 12 make up a capacitor. The polysilicon film 34 may be deposited by, for example, CVD or sputtering. The second silicon oxide film 32 functions as a protective film for protecting the polysilicon film 34 when the sacrificial layer, which is made of a polysilicon or an amorphous silicon, is etched. The second silicon oxide film 32 may be formed by thermal oxidation, sputtering, CVD, and so on.

The polysilicon film 34 is covered by a second film 36, or a third silicon oxide film 36, except for a contact hole. The through holes 32*a*, 34*a* are plugged by the third silicon oxide film 36. The third silicon oxide film 36 has been formed by reflowing a layer made of a material that becomes viscous and reflow when the material is heated. The material may be made of, for example, PSG, which is a silicon oxide film doped with phosphorous, or BPSG, which is a silicon oxide film doped with boron and phosphorous.

The membrane 30 is made up of a portion of the silicon oxide film 32, a portion of the polysilicon film 34, a portion of the third silicon oxide film 36, and a portion of passivation film 40, which is a protective film described later. The portions are located above the cavity 20 in FIG. 2. The cavity 20 is hermetically sealed using a membrane 30 to form a pressure reference chamber, the pressure in which is maintained constant, for example, at a level close to vacuum.

As shown in FIG. 2, the third silicon oxide film 36 is covered by the passivation film 40, which is made of, for example, silicon nitride. The passivation film 40 may be formed using, for example, CVD or sputtering. The passivation film 40 covers and protects all the elements located on the active surface of the silicon substrate 10.

As shown in FIG. 2, two contact electrodes 50, 51 are located outside the membrane 30. One of the contact electrodes 50 is electrically connected to the low resistivity layer 12 through a contact hole in the silicon oxide film 14 and a contact hole in the third silicon oxide film 36. The other of the contact electrodes 51 is electrically connected to the polysilicon film 34 through a contact hole in the third silicon oxide film 36. The contact electrodes 50, 51 are made of a metal such as aluminum. The metal may be deposited by, for example, vapor phase deposition.

In the pressure sensor S1 of FIG. 2, a capacitor is formed using the polysilicon film 34 and the low resistivity layer 12, and the capacitance of the capacitor is detected. The membrane 30 deforms due to ambient pressure to change the distance between the polysilicon film 34 and the low resistivity layer 12. The capacitance of the capacitor is changed in response to the distance between the polysilicon film 34 and the low resistivity layer 12, so the pressure can be detected by detecting the capacitance. That is, the pressure sensor S1 of FIG. 2 functions as a parallel plate capacitive pressure sensor.

Figure 3A:
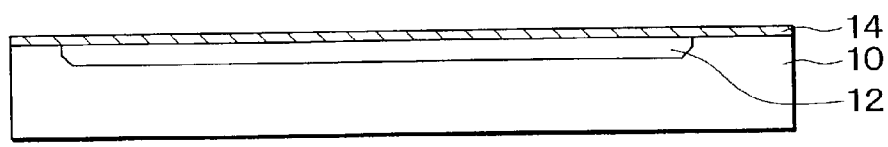
FIGS. 3A to 3G are schematic cross-sectional views showing a method for manufacturing the pressure sensor of FIG. 2.

Next, a method for manufacturing the pressure sensor S1 of FIG. 2 will be described. Firstly, as shown in FIG. 3A, a low resistivity layer 12, which is an impurity diffusion layer, is formed in the active surface of a silicon substrate 10 by ion implantation or diffusion. Then, a first silicon oxide film 14 is formed by thermal oxidation, sputtering, or CVD on the active surface of the silicon substrate 10.

Figure 3B:
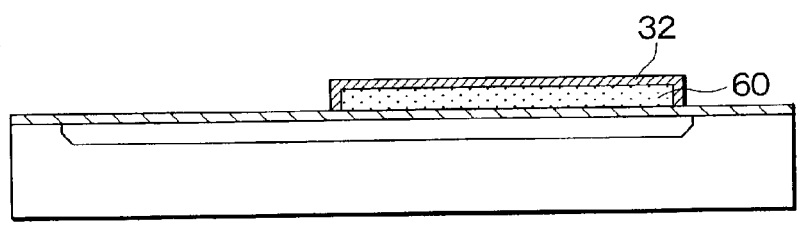

Then, as shown in FIG. 3B, a sacrificial layer 60 is formed at the position where a cavity 20 is to be formed on the first silicon oxide film 14. For example, the sacrificial layer 60 is formed by depositing a polysilicon film using CVD or sputtering and patterning the film using photolithography and etching into the shape of, for example, a flat disc. The shape of the cavity 20 is substantially determined by the shape of the sacrificial layer 60. Next, as shown in FIG. 3B a second silicon oxide film 32 is formed on the surface of the sacrificial layer 60 by, for example, thermally oxidizing the surface of the sacrificial layer 60. Incidentally, the sacrificial layer 60 may be made of amorphous silicon instead of polysilicon. Furthermore, the second silicon oxide film 32 may be deposited by sputtering or CVD.

Figure 3C:
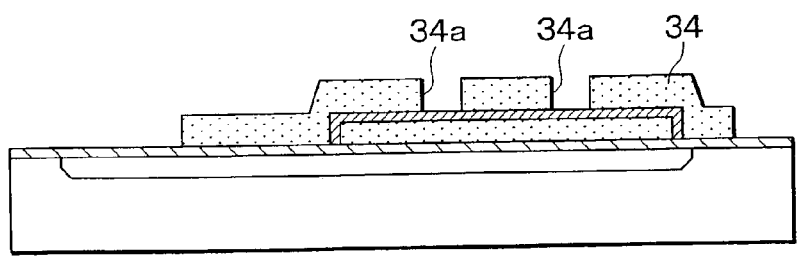

Then, a polysilicon layer, from which a first film 34, or a polysilicon film 34, is formed, is deposited to cover the second silicon oxide film 32 by, for example, CVD or sputtering. Then, as shown in FIG. 3C, the polysilicon layer is patterned using photolithography and etching to form the polysilicon film 34, which has through holes 34*a*.

Figure 3D:
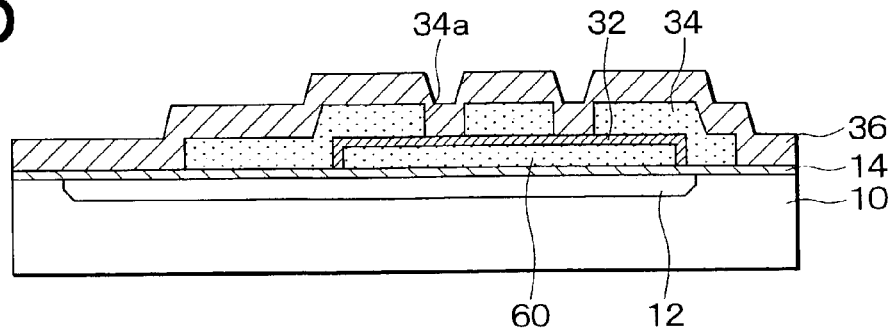

Next, as shown in FIG. 3D, a silicon oxide layer 36 (reflow layer), from which a second film 36, or a third silicon oxide film 36, is formed, is deposited to cover the polysilicon film 34. The silicon oxide layer 36 is made of PSG or BPSG, which becomes viscous with heated, and formed by, for example, CVD. The through holes 34*a* in the polysilicon film 34 are plugged by the silicon oxide layer 36, as shown in FIG. 3D.

Figure 3E:
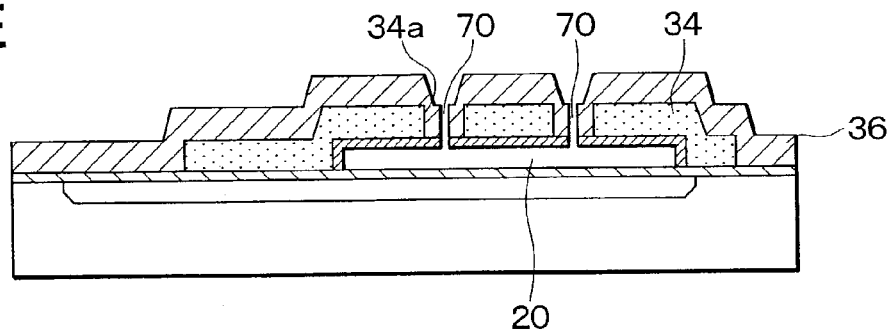

Then, as shown in FIG. 3E, etching holes 70 are formed by, for example, photolithography and dry etching at the positions corresponding to the through holes 34*a* in the polysilicon film 34 to permit the sacrificial layer 60 to be exposed to the outside with the polysilicon film 34 kept covered by the silicon oxide layer 36. Next, the cavity 20 is formed by etching the sacrificial layer 60 through the etching holes 70. The sacrificial layer 60 is etched using an etching method in which polysilicon or amorphous silicon, which makes up the sacrificial layer 60, are selectively etched, but silicon oxide is not substantially etched. The etching method may be a wet etching using an etchant that includes potassium hydroxide (KOH) or tetramethylammoniumhydroxide (TMAH), or a dry etching using a gas such as xenon fluoride (XeF2).

The polysilicon film 34 should not be exposed on the inner walls that define the etching holes 70 when the etching holes 70 are formed. If the polysilicon film 34 were to be exposed, the polysilicon film 34 would be gradually etched from the exposed portion. Furthermore, the diameter of the etching holes 70 should preferably be small, and the number of the holes should preferably be kept to a minimum in order to better seal the etching holes 70 in a subsequent manufacturing step. However, they are a trade-off for the easiness in supplying the above etching material to the sacrificial layer 60. Therefore, an optimal number of holes and an optimal hole diameter should be chosen.

Figure 3F:
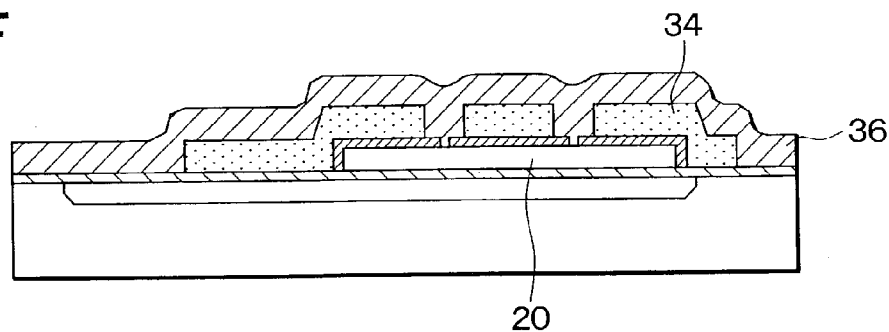

Next, the silicon oxide layer 36, which is made of PSG or BPSG, is reflowed by heating at approximately 900° C. in vacuum to plug the etching holes 70, as shown in FIG. 3F. As a result, the cavity 20, or a pressure reference chamber, which has a pressure level close to vacuum and is hermetically sealed, is formed.

Figure 3G:
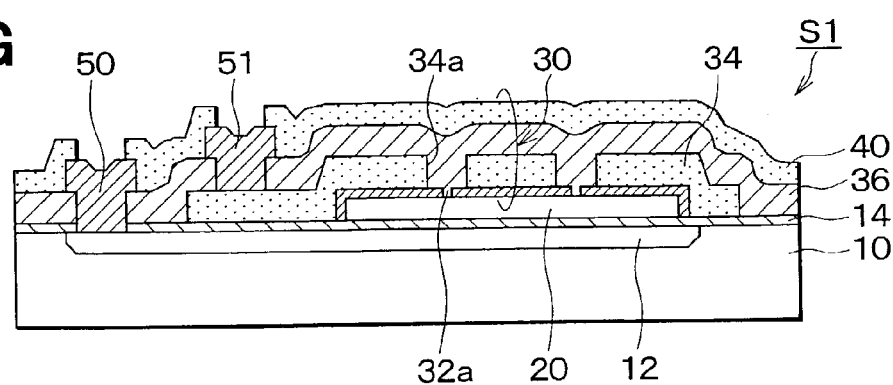

Next, as shown in FIG. 3G, contact holes are formed in the silicon oxide film 14 and the third silicon oxide film 36 by, for example, dry etching. With the contact hole forming, a second film 36, or a third silicon oxide film 36, is completed. Then, a conductive film is deposited and contact electrodes 50, 51 are patterned out of the conductive film. Then, for example, a silicon nitride film 40 is deposited to form a passivation film 40 and complete a membrane 30, and the silicon nitride film 40 is partially etched to expose the contact electrodes 50, 51. With the above manufacturing steps, a pressure sensor S1 of FIG. 2 is completed.

Figure 1A:
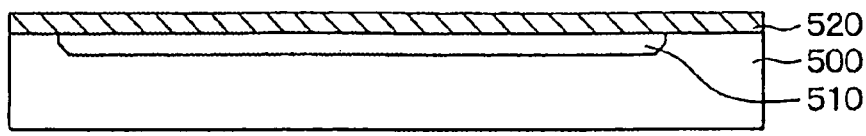
FIGS. 1A to 1F are schematic cross-sectional views showing a method for manufacturing a proposed surface micromachined pressure sensor.
Figure 1B:
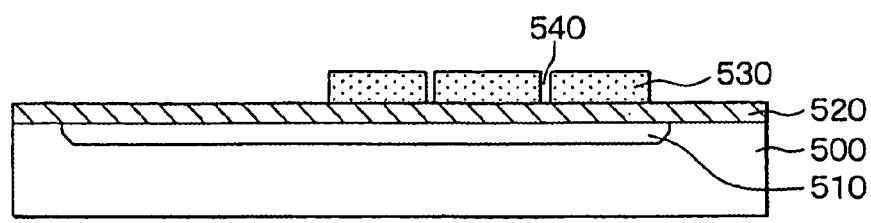
Figure 1C:
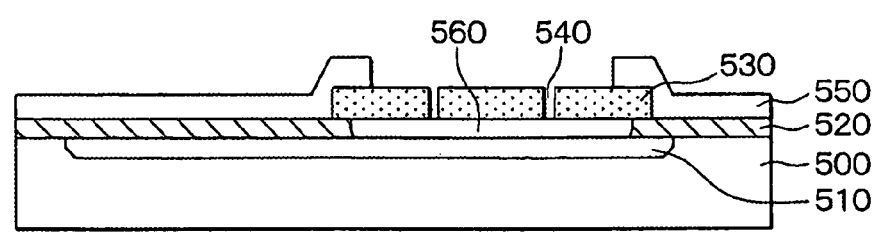
Figure 1D:
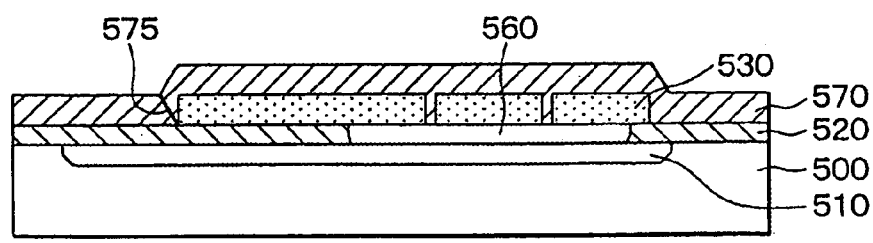
Figure 1E:
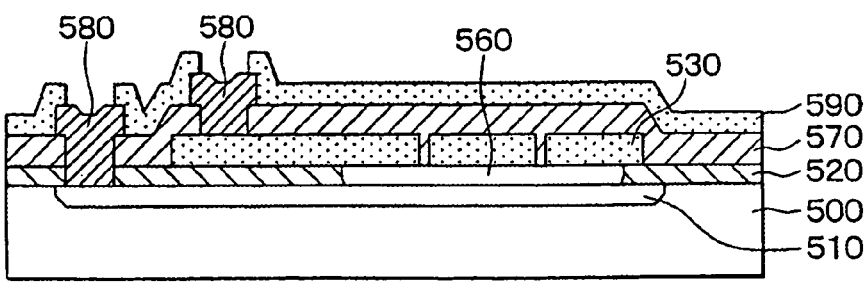
Figure 1F:
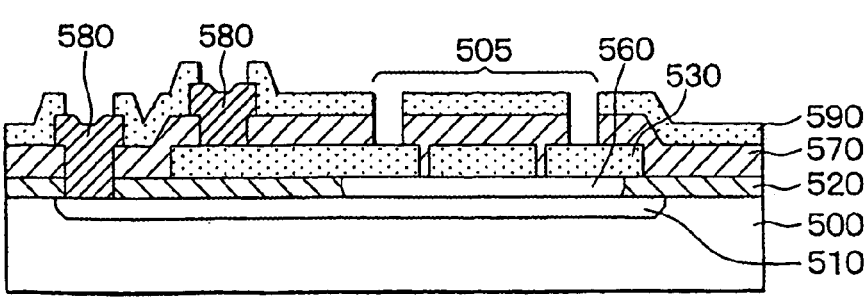

The first and the second silicon oxide films 14, 32 function as an etch stop when the first sacrificial layer 60 is etched according to the process shown in FIGS. 3A to 3G. Therefore, it is possible to precisely control the dimensions of the cavity 20 and the dimensions of the membrane 30. Therefore, the process shown in FIGS. 3A to 3G does not require a manufacturing step for defining a deformation part 505 shown in FIG. 1F.

In addition, the etching holes 70 are plugged not when the silicon oxide layer 36 is deposited, but after the silicon oxide layer 36 is deposited by reflowing the silicon oxide layer 36.

That is, the cavity 20 has not yet been formed when the silicon oxide layer 36 is deposited, so the silicon oxide layer 36 would not seep into the cavity 20 when the silicon oxide layer 36 is deposited. Even when the silicon oxide layer 36 is reflowed, the silicon oxide layer 36 does not seep into the cavity 20 through the etching holes in the second silicon oxide film 32, as long as the dimensions and the number of the etching holes 70 are appropriately controlled. In addition, even it slits are generated in the silicon oxide layer 36, the slits are repaired when the silicon oxide layer 36 is reflowed. Therefore, the third silicon oxide film 36 is better in hermetic sealing than the silicon oxide film 570 of the proposed pressure sensor.

Moreover, in the proposed pressure sensor manufactured by the process shown by FIGS. 1A to 1F, the pressure inside the cavity 560 is determined by the pressure and the atmosphere when the silicon oxide film 570 is deposited. On the other hand, in the pressure sensor S1 manufactured by the process shown by FIGS. 3A to 3G, the pressure inside the cavity 20 is substantially determined by the pressure and the atmosphere when the silicon oxide layer 36 is reflowed.

The pressure level and atmosphere when the silicon oxide layer 36 is reflowed can be arbitrarily chosen, so there is a higher degree of flexibility in determining the pressure inside the cavity 20. As a result, the pressure inside the cavity 20 can be set at a predetermined level in order to prevent the membrane 30 deforming due to the pressure change inside the cavity 20 or in order to improve thermally insulation capability of the membrane 30. Therefore, the process shown by FIGS. 3A to 3G makes it possible to form a pressure reference chamber having a pressure level appropriate for the pressure to be detected.

Thus, according to the process shown by FIGS. 3A to 3G, it is possible to provide a surface micromachined semiconductor device, in which a cavity located on the active surface of a semiconductor substrate is hermetically sealed by a membrane, and which has good membrane characteristics and high reliability in hermetic sealing of the cavity.

Although the pressure sensor S1 of FIG. 2 is a discrete sensor, the process shown by FIGS. 3A to 3G can be readily applied to an integrated pressure sensor, in which pressure detecting elements and integrated circuits have been formed on a single chip, because the process shown by FIGS. 3A to 3G has a superior compatibility with the process for manufacturing an LSI chip. For example, the manufacturing steps of FIGS. 3A to 3C may be accomplished using manufacturing steps that are ordinarily used for forming an impurity diffusion layer, an interlayer dielectric film, and a polysilicon layer of a transistor.

In other words, the pressure sensor S1 of FIG. 2 can be manufactured using an ordinal LSI process except for the etching of the sacrificial layer 60. Especially, if the pressure sensor S1 of FIG. 2 is manufactured using, for example, the process for an EPROM, a minimum of one extra mask needs to be added to the manufacturing steps for forming two polysilicon layers of the EPROM in order to form the through holes 34a in the polysilicon film 34.

The structures and the materials for the various parts making up the pressure sensor S1 of FIG. 2 are not limited to the above example. For example, the second film 36 may not be made of PSG or BPSG. Any film has a possibility to be used for the second film 36 as long as the material making up the film becomes viscous and reflows at a temperature lower than the temperatures at which other parts are formed for making up the pressure sensor S1 of FIG. 2 before the second film 36 is reflowed in the manufacturing process.

Furthermore, instead of the low resistivity layer 12, an electrode made of another material such as a metal or a polysilicon may be formed on the active surface of the silicon substrate 10.

Instead of the first silicon oxide film 14 and the second silicon oxide film 32, which are used for protecting the silicon substrate 10 and the polysilicon film 34 when the sacrificial layer 60 made of either polysilicon or amorphous silicon is etched, a film made of a material such as silicon nitride, which is not etched when the sacrificial layer 60 is etched, may be used.

Furthermore, instead of the polysilicon film 34, an electrode made of, for example, an amorphous silicon film, which provides similar features as the polysilicon film 34, may be used.

A diverse choice of materials is possible for the alternatives to the first silicon oxide film 14, the second silicon oxide film 32, and the polysilicon film 34. However, appropriate materials need to be chosen for each film, 14, 32, 34 depending on the type of material making up the sacrificial layer 60.

Figure 4A:
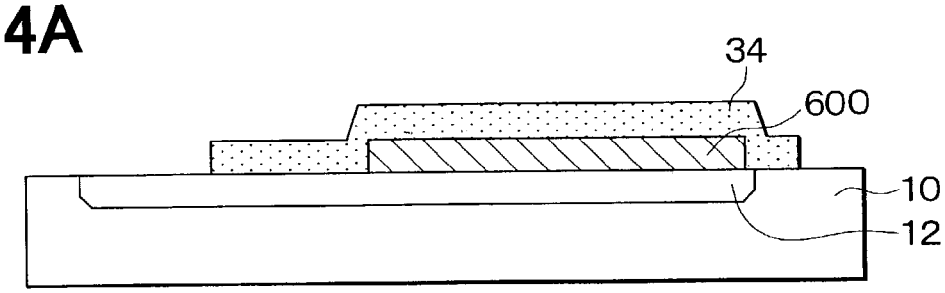
FIGS. 4A to 4C are schematic cross-sectional views showing a method for manufacturing a surface micromachined pressure sensor similar to the pressure sensor of FIG. 2.
Figure 4B:
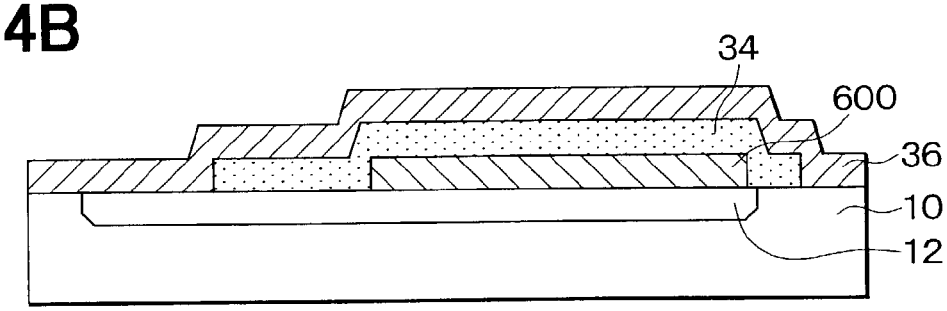
Figure 4C:
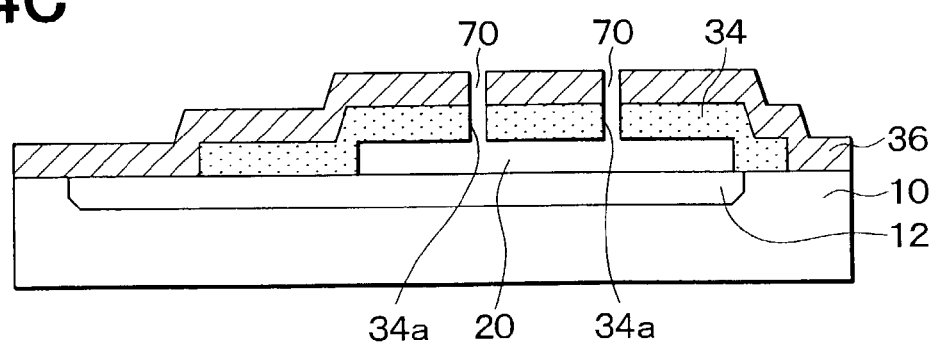

Furthermore, the first and the second silicon oxide films 14, 32 are not required if the silicon substrate 10 and the polysilicon film 34 are not substantially etched when the sacrificial layer 60 is etched, as shown in FIGS. 4A to 4C. In FIGS. 4A and 4B, a sacrificial layer 600 is made of silicon nitride. As shown in FIG. 4A, the sacrificial layer 600 is formed at the position where a cavity 20 is to be formed on the active surface of a silicon substrate 10, in which a low resistivity layer 12 has already been formed. Then, a first film 34, or a polysilicon film 34, is formed to cover the sacrificial layer 600.

Next, as shown in FIG. 4B, a silicon oxide layer 36 (reflow layer) made of PSG or BPSG, from which a second film 36 is formed, is formed to cover the polysilicon film 34 without forming any through holes in the polysilicon film 34. Then, as shown in FIG. 4C, etching holes 70 and through holes 34a are simultaneously formed by, for example, photolithography and dry etching to permit the sacrificial layer 600 to be exposed to the outside. The polysilicon film 34 is not substantially etched when the sacrificial layer 60, which is made of silicon nitride, is etched, so there is no need to cover the sidewalls that define the through holes 34a with the second film 36. Thus, the etching holes 70 and the through holes 34a may be simultaneously formed.

Next, the sacrificial layer 60 is etched through the etching holes 70 and the through holes 34a using an etching material such as heated phosphoric acid aqueous solution, which selectively etches silicon nitride, in order to form the cavity 20. Subsequently, as in the manufacturing step of FIG. 3F, the silicon oxide layer 36 is reflowed by heating in order to plug the etching holes 70. Then, using the same manufacturing steps shown in FIG. 3G, contact holes are formed in the silicon oxide layer 36; contact electrodes 50, 51 are formed; a passivation film 40 is formed to permit the contact electrodes 50, 51 to be exposed to complete a pressure sensor. The pressure sensor manufacture using the manufacturing steps shown in FIGS. 4a to 4C provides similar effects to the pressure sensor of FIG. 2, which is manufactured using the manufacturing steps shown in FIGS. 3a to 3G.

Furthermore, instead of the first film 34, which is made up of the polysilicon film 34, a first film made up of two layers may be used. For example, the two layers are formed by forming an insulating layer made of an insulating material such as silicon nitride to cover a sacrificial layer and forming a conductive layer made of a conductive material such as a metal and polysilicon to cover the insulating layer. In the first film made up of two layers, the insulating layer functions as a part of a membrane, or a diaphragm, and the conductive layer functions as an electrode.

Other Embodiments

Although the pressure sensor S1 of FIG. 2 is a parallel-plate-type capacitive pressure sensor, the present invention may be applied to a pressure sensor in which an impurity diffusion layer that functions as a strain gauge has been formed in a polysilicon film located in a membrane. In such a pressure sensor, the pressure applied to the sensor is detected using the strain gauge, so an electrode such as the low resistivity layer 12 of FIG. 2 is not needed.

Furthermore, the present invention may be applied to a thermopile infrared sensor. Such a sensor can be manufactured by, for example, forming a silicon nitride film as a first film instead of the polysilicon film 34 at a manufacturing step equivalent to the one shown in FIG. 3C; forming a thermocouple using, for example, polysilicon wiring lines and aluminum wiring lines on the first film; then forming a second film to cover the thermocouple at a manufacturing step equivalent to the one shown in FIG. 3D; and carrying out manufacturing steps similar to the ones shown in FIGS. 3E to 3G. The sensitivity of the infrared sensor is relatively high because the inside of a cavity, with which a membrane including the thermocouple is thermally insulated from a substrate, is maintained at high vacuum.

Furthermore, the present invention may be applied to a capacitive acceleration sensor and a capacitive angular velocity sensor. In such a sensor, for example, a comb-shaped movable electrode has been formed inside a cavity. By maintaining the inside of the cavity at high vacuum, a highly sensitive capacitive acceleration sensor and a highly sensitive capacitive angular velocity sensor can be manufactured because the sensor is not susceptible to external disturbances.

What is claimed is:

1. A method for manufacturing a semiconductor device including a semiconductor substrate and a membrane, wherein a cavity is located between an active surface of the semiconductor substrate and the membrane and hermetically sealed, the method comprising:

forming a sacrificial layer at a position where a cavity is to he formed on an active surface of a semiconductor substrate;

forming a first film, a part of which is to be a part of a membrane, to cover the sacrificial layer;

forming a through hole, which extends through the first film;

forming a reflow layer, which is made of a material that becomes viscous when heated, to cover the first film such that the through hole are plugged by the reflow layer;

forming an etching hole, which permits the sacrificial layer to be exposed to an outside, such that the etching hole is located at a position corresponding to the through hole;

etching the sacrificial layer through the etching hole to form a cavity; and reflowing the reflow layer by heating to form a second film, a part of which is to be a part of the membrane, wherein the etching hole and the through hole are plugged by the second film when the reflow layer is reflowed.

2. The method according to claim 1, wherein the etching hole is formed such that a sidewall that defines the through hole is covered by the second film and wherein the first film is protected by the second film when the sacrificial layer is etched.

3. A method for manufacturing a semiconductor device including a semiconductor substrate and a membrane, wherein a cavity is located between an active surface of the semiconductor substrate and the membrane and hermetically sealed, the method comprising:

forming a sacrificial layer at a position where a cavity is to be formed on an active surface of a semiconductor substrate;

forming a first film, a part of which is to be a part of a membrane, to cover the sacrificial layer;

forming a reflow layer, which is made of a material that becomes viscous when heated, to cover the second film;

forming simultaneously a through hole, which extends through the first film, and an etching hole, which permits the sacrificial layer to be exposed to an outside;

etching the sacrificial layer through the etching hole to form a cavity; and reflowing the reflow layer by heating to form a second film, a part of which is to be a part of the membrane, wherein the etching hole and the through hole are plugged by the second film when the reflow layer is reflowed.

4. A semiconductor device having a membrane comprising:

a semiconductor substrate, which has an active surface; and a membrane, wherein a cavity is located between the active surface and the membrane and hermetically sealed, wherein the membrane includes:

a first film, which has a through hole that extends through the first film; and a second film, which has been formed by reflowing a reflow layer made of a material that becomes viscous and reflows when heated, wherein the through hole has been plugged by the second film to hermetically seal the cavity.

* * * * *